United States Patent [19]
Masuoka

[11] Patent Number: 4,902,914
[45] Date of Patent: Feb. 20, 1990

[54] LOGIC CIRCUIT USED IN STANDARD IC OR CMOS LOGIC LEVEL

[75] Inventor: Hideaki Masuoka, Yokohama, Japan

[73] Assignee: Kabushiki Kaisha Toshiba, Kawasaki, Japan

[21] Appl. No.: 154,066

[22] Filed: Feb. 9, 1988

[30] Foreign Application Priority Data

Feb. 17, 1987 [JP] Japan .................................. 62-34133

[51] Int. Cl.[4] .................... H03K 19/02; H03K 19/092; H03K 19/096
[52] U.S. Cl. ..................................... 307/446; 307/451; 307/452; 307/570; 307/571
[58] Field of Search ................ 307/443, 446, 452, 475, 307/571, 451, 570, 263, 272.1

[56] References Cited

U.S. PATENT DOCUMENTS

| | | | |
|---|---|---|---|
| 4,616,146 | 10/1986 | Lee et al. | 307/446 |
| 4,638,186 | 1/1987 | McLaughlin | 307/446 |
| 4,678,940 | 7/1987 | Vasseghi et al. | 307/443 |
| 4,694,202 | 9/1987 | Iwamura et al. | 307/446 |

FOREIGN PATENT DOCUMENTS

| | | |
|---|---|---|
| 0145004 | 6/1985 | European Pat. Off. . |
| 0212004 | 3/1987 | European Pat. Off. . |
| 0202628 | 11/1983 | Japan .................. 307/473 |

OTHER PUBLICATIONS

Patent Abstracts of Japan, vol. 9, No. 69 (E-305)[1792], Mar. 29, 1985; & JP—A—59 205 828 (Nippon Denki K.K.) 21-11-1984.
Wakeman, "High—Speed—CMOS—Designs Address Noise and I/O Levels," EDN Electrical Design News, vol. 29, No. 8, pp. 285-290, 294, 296, Apr. 1984.

Primary Examiner—Stanley D. Miller
Assistant Examiner—Margaret Rose Warbach
Attorney, Agent, or Firm—Finnegan, Henderson, Farabow, Garrett and Dunner

[57] ABSTRACT

A logic circuit includes first and second NPN bipolar transistors whose collector-emitter paths are serially connected between a power source potential terminal and a ground terminal, the connection node of the first and second bipolar transistors being connected to a signal input terminal; a first CMOS logic circuit having an input terminal connected to a signal input terminal and an output terminal connected to the base of the first NPN bipolar transistor; a second CMOS logic circuit having an input terminal connected to the signal input terminal and an output terminal connected to the signal output terminal; a first switching circuit connected between the signal output terminal and the base of the second bipolar transistor, and to be set OFF when an input signal is set at a level at which the first NPN bipolar transistor is rendered conductive, and to be set ON when the input signal is set at a level at which the first NPN bipolar transistor is rendered nonconductive; and a second switching circuit connected between the second potential supply source and the base of the second NPN bipolar transistor, and to be set OFF when the input signal is set at a level at which the first NPN bipolar transistor is rendered conductive, and to be set ON when the input signal is set at a level at which the first NPN bipolar transistor is rendered nonconductive.

6 Claims, 5 Drawing Sheets

LOGIC CIRCUIT USED IN STANDARD IC OR CMOS LOGIC LEVEL

BACKGROUND OF THE INVENTION

1. Field of the Invention

This invention relates to a logic circuit used in a standard IC of CMOS logic level, and more particularly to a logic circuit attaining high speed operation.

2. Description of the related art including information disclosed under §§1.97–1.99

In general, a logic circuit used in a standard IC of CMOS logic level includes a CMOS inverter circuit, as shown in FIG. 1, for example. The CMOS inverter circuit shown in this Figure includes a P channel MOSFET 12 and an N channel MOSFET 13 which are serially connected between power source potential (Vcc) terminal 11 and ground terminal Vss. Input terminal T1 is connected to the gates of MOSFETs 12 and 13 and output terminal T2 is connected to the connection point therebetween. The input threshold voltage of the logic circuit of the above CMOS structure is set at an intermediate level between power source potential Vcc and ground potential Vss, and the amplitude of an output signal is large. Since no through current flows from power source potential Vcc terminal 11 to ground terminal Vss at times other than the switching transition time, this circuit therefore not only has a high resistance to noise but also a low power consumption.

FIG. 2 shows characteristics between an output voltage and an output current of the CMOS inverter circuit of FIG. 1 when an output signal of "L" level is generated. As is clearly seen from the characteristics, the CMOS inverter circuit will have output resistor $R_{ON}$ of constant resistance in the range of low output voltage.

Since an input capacitor of an external circuit and capacitive load $C_L$ such as a wiring layer having a parasitic capacitance may be connected to output terminal T2, an equivalent circuit including the load of the inverter circuit of FIG. 1 may be obtained as shown in FIG. 3. In FIG. 3, resistor $R_{ON}$ is an ON resistance of P channel MOSFET 12 and N channel MOSFET 13 and inductor L corresponds to the sum of the inductance of an internal wiring layer and the inductance of a wiring layer to the external circuit. Further, capacitor $C_L$ represents an input capacitance.

In the FIG. 3 circuit, a potential difference across load $C_L$ or output voltage V is monotonically attenuated at the falling time of an output signal or at the switching time of movable contact ST1 of switch SW from fixed contact ST2 to fixed contact ST3 if resistor $R_{ON}$ has a sufficiently high resistance. However, in a CMOS inverter circuit which is required to have a high speed operation, it is necessary to set resistor $R_{ON}$ sufficiently low. For this reason, output voltage V is attenuated in the cosine waveform as shown in FIG. 4, causing a ringing oscillation.

In a case where ON-resistor $R_{ON}$ is set to have a low resistance, a series resonant circuit of inductor L and capacitor $C_L$ will not receive a sufficiently large damping effect, causing the potential difference across resistor $R_{ON}$ to be set at a low level. However, in this case, the potential differences across inductor L and capacitor $C_L$ are generated in a resonant waveform, thus causing the ringing oscillation. Further, when the resistance of ON-resistor $R_{ON}$ is set at a low level, the ringing also occurs at the time of rising of an output signal.

When the ON-resistances of MOSFETs 12 and 13 are set at a low level to enhance the operation speed, a large current or rush current flows from power source potential Vcc terminal 11 to ground terminal Vss at the switching transition time at which MOSFETs 12 and 13 are set ON at the same time. Thus, power source potential Vcc is instantaneously lowered, generating noise and the power consumption is increased.

SUMMARY OF THE INVENTION

An object of this invention is to provide a logic circuit which can attain both the high operation speed and low power consumption and suppress the ringing of an output waveform to provide good output characteristics.

According to one embodiment of this invention, there is provided a logic circuit comprising first and second bipolar transistors whose collector-emitter paths are serially connected between first and second potential supply sources, the connection node of the first and second bipolar transistors being connected to a signal output terminal; a first CMOS logic circuit having an input terminal connected to a signal input terminal and an output terminal connected to the base of the first bipolar transistor; a second CMOS logic circuit having an input terminal connected to the signal input terminal and an output terminal connected to the signal output terminal; a first switching circuit connected between the signal output terminal and the base of the second bipolar transistor, to be set OFF when input data is set at a level at which the first bipolar transistor is rendered conductive, and to be set ON when the input data is set at a level at which the first bipolar transistor is rendered nonconductive; and a second switching circuit connected between the second potential supply source and the base of the second bipolar transistor, to be set OFF when the input data is set at a level at which the first bipolar transistor is rendered conductive, and to be set ON when the input data is set at a level at which the first bipolar transistor is rendered nonconductive.

With this construction, a large current is conducted due to the operation of the first or second bipolar transistor at the beginning of the output signal to rise or fall, causing a voltage at the signal output terminal to be rapidly pulled up or down. Then, after the potential at the signal output terminal has reached a certain potential level, the first and second bipolar transistors are both turned OFF so that the potential at the signal output terminal can be set to a CMOS logic level of "H" or "L" only by the output signal of the second CMOS logic circuit. Thus, a high speed operation can be attained by means of a low resistance of the bipolar transistor at the beginning of change in the signal level without reducing the ON-resistance of the CMOS logic circuit. Further, after the potential at the signal output terminal has reached a certain level, only the resistance of the CMOS circuit can be effective, causing no ringing.

Further, the first and second bipolar transistors are both kept OFF when the output signal is kept at "H" or "L" level, preventing the first and second bipolar transistors from being turned ON at the same time even at the switching transition time. Thus, both the high speed operation and low power consumption can be attained.

DETAILED DESCRIPTION OF THE PREFERRED EMBODIMENTS

Figure 5:
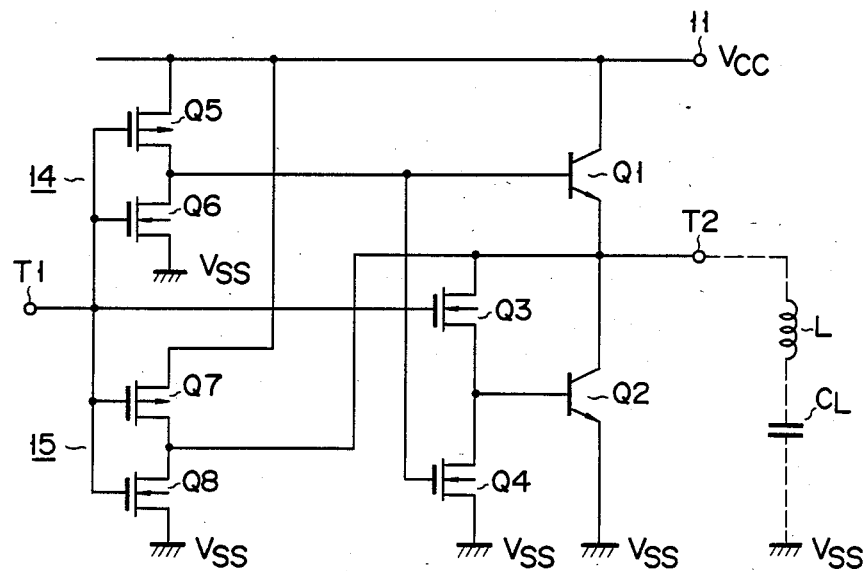
FIG. 5 is a circuit diagram of a logic circuit according to one embodiment of this invention.

FIG. 5 shows a logic circuit according to one embodiment of this invention.

The logic circuit of this embodiment acts an inverter circuit and includes NPN bipolar transistors Q1 and Q2 whose current paths or collector-emitter paths are connected between power source potential Vcc terminal 11 and ground terminal Vss. The connection node of transistors Q1 and Q2 is connected to output terminal T2. Transistor Q1 acting as a pull-up transistor is controlled by an output signal from CMOS inverter 14, while transistor Q2 acting as a pull-down transistor is controlled according to the conduction states of N channel MOSFETs Q3 and Q4 CMOS inverter 15 is provided in the inverter circuit to directly drive the potential at output terminal T2 by an output signal of this inverter 15.

The current path of N channel MOSFET Q3 is connected between output terminal T2 and the base of bipolar transistor Q2, and the gate thereof is connected to input terminal T1. The current path of N channel MOSFET Q4 is connected to the base of bipolar transistor Q2 and ground terminal Vss, and the gate thereof is connected to the output terminal of CMOS inverter 14.

CMOS inverter 14 is formed of P channel MOSFET Q5 and N channel MOSFET Q6 serially connected between power source potential Vcc terminal 11 and ground terminal Vss. The gates of MOSFETs Q5 and Q6 are connected to input terminal T1. CMOS inverter 15 is formed of P channel MOSFET Q7 and N channel MOSFET Q8 serially connected between power source potential Vcc terminal 11 and ground terminal Vss. The input terminal of CMOS inverter 15 is connected to input terminal T1, and the output terminal thereof is connected to output terminal T2.

A series resonance circuit made up of inductor L and capacitor $C_L$ is connected between power source potential Vcc terminal 11 and ground terminal Vss. The series resonance circuit is an equivalent circuit of the input stage of a different circuit whose input terminal is connected to output terminal T2. Inductor L corresponds to the sum of the inductance of the internal wirings and that of the wiring to the external circuit. Capacitor $C_L$ corresponds to the input capacitance of the circuit connected to output terminal T2 or the load capacitance of the circuit to be driven by this inverter circuit.

The operation of the inverter circuit shown in FIG. 5 will now be described in detail.

Figure 6:
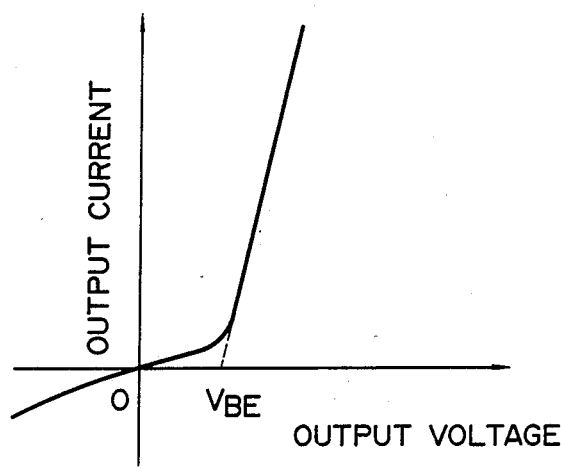
FIG. 6 is a characteristic diagram showing the relation between output voltage and output current of the logic circuit shown in FIG. 5.

When an input signal of "H" level is supplied to input terminal T1, MOSFETs Q3, Q6, and Q8 are all turned ON. In this case, if the voltage at output terminal T2 is set higher than voltage $V_{BE}$ between the base and emitter of bipolar transistor Q2, a base current flows from output terminal T2 to bipolar transistor Q2 via MOSFET Q3 which is now set ON, turning bipolar transistor Q2 ON. This causes a large current to flow from load capacitor $C_L$ to ground terminal Vss, rapidly changing to "L" level the voltage at output terminal T2. In contrast, when the voltage at output terminal T2 is lower than voltage $V_{BE}$ between the base and emitter of bipolar transistor Q2, bipolar transistor Q2 is kept OFF. This results in a small current flowing from load capacitor $C_L$, connected to output terminal T2, to ground terminal Vss via MOSFET Q8, slowly changing to "L" level the voltage at output terminal T2. Thus, the output current-output voltage characteristic at the time of the falling of the output signal is nonlinear, as is shown in FIG. 6.

In other words, at the beginning of the falling of an output signal, or when voltage at output terminal T2 is higher than $V_{BE}$, transistors Q2 and Q8 are set in the ON state so that the ON-resistance can be set at a low level. As a result, charges stored in load capacitor $C_L$ connected to output terminal T2 are rapidly discharged. When the voltage at output terminal T2 drops to less than $V_{BE}$, transistor Q2 is turned OFF and only transistor Q8 is turned ON, thereby setting the ON-resistance at a high level. For this reason, a large damping is applied to the series resonant circuit of L and $C_L$.

Figure 7:
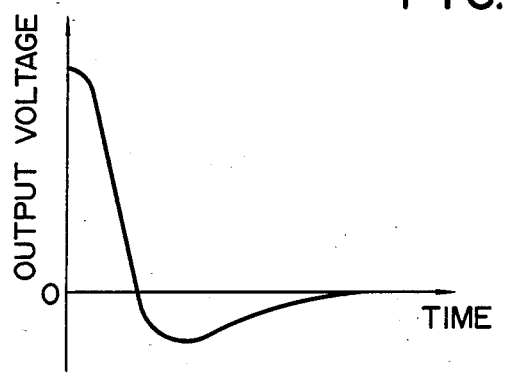
FIG. 7 is an output voltage characteristic diagram of logic circuit of FIG. 5.

Thus, a signal can be changed at high speed from the beginning of the falling to $V_{BE}$, and then changed slowly from $V_{BE}$ to "L" level, permitting both the high speed switching operation and the damping for ringing to be attained. As a result, output voltage V applied to load $C_L$ shown in FIG. 7 is obtained. The reason the output voltage becomes negative during a certain period is that inductor L is connected as shown in FIG. 5.

When an input signal of "L" level is supplied to input terminal T1, MOSFETs Q4, Q5, and Q7 are turned ON. At this time, if voltage at output terminal T2 is lower than "Vcc$-V_{BE}$", transistor Q1 is turned ON, permitting a large current to flow. In contrast, when the voltage is higher than "Vcc$-V_{BE}$", transistor Q1 is turned OFF, causing a small current to flow. Therefore, even at the time of the rising of an output signal, both the high speed switching operation and ringing damping can be attained.

Since the potential at output terminal T2 can be finally determined by an output signal of CMOS inverter 15, the logic level will always reflect the CMOS logic level.

In the case where an output signal is stably set at "H" or "L" level, transistors Q1 and Q2 are both turned OFF. Since only one of transistors Q1 and Q2 is turned ON at the switching transition time, a through current cannot flow via transistors Q1 and Q2, and instead flows via CMOS inverters 14 and 15. However, since the NPN bipolar transistors Q1 and Q2 used in this case have a large current driving ability, the current driving abilities of MOSFETs Q5 to Q8 can therefore be set small. Thus, the current consumption of the CMOS inverter circuit can be made comparatively small in relation to the prior art CMOS inverter circuit designed for high speed operation. Further, if the current driving ability of MOSFETs Q5 to Q8 can be set small, the load of a preceding stage circuit for driving the inverter circuit can be made substantially small when viewed from the preceding stage circuit towards the inverter circuit. In this respect, the operation speed can be further enhanced.

Figure 8:
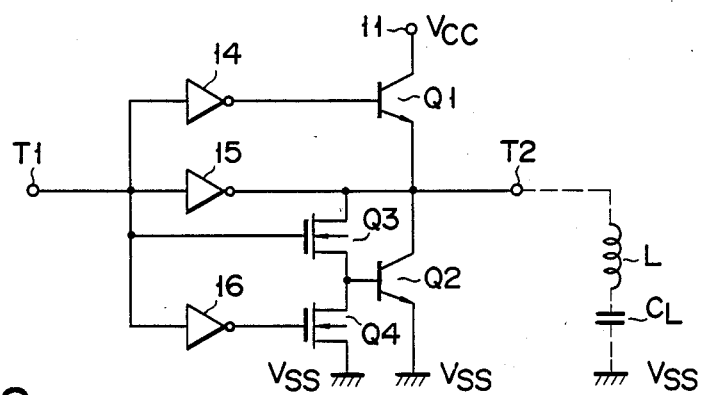
FIGS. 8 to 11 are circuit diagrams of logic circuits according to other embodiments of this invention.

FIG. 8 shows a inverter circuit according to a second embodiment of this invention. In FIG. 8, CMOS inverters 14 and 15 of FIG. 5 are shown in the form of logic representations.

Figure 1:
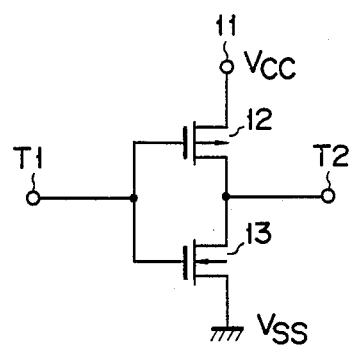
FIG. 1 is a circuit diagram showing the prior art logic circuit.
Figure 2:
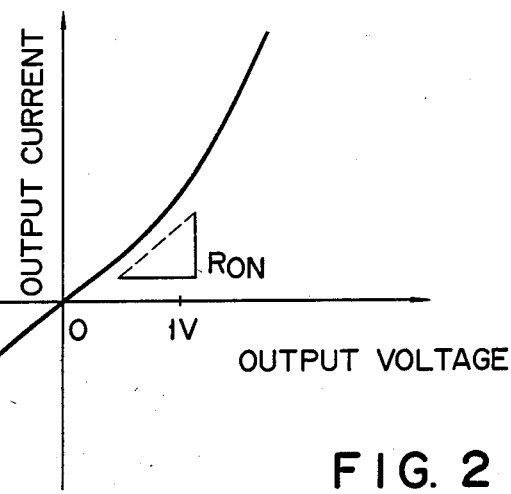
FIG. 2 is a characteristic diagram showing the relation between output voltage and output current of the logic circuit shown in FIG. 1.
Figure 3:
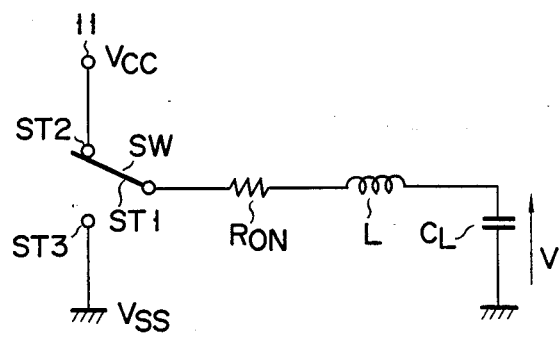
FIG. 3 is a circuit diagram of an equivalent circuit of the logic circuit shown in FIG. 1 set in the "H" level outputting state.
Figure 4:
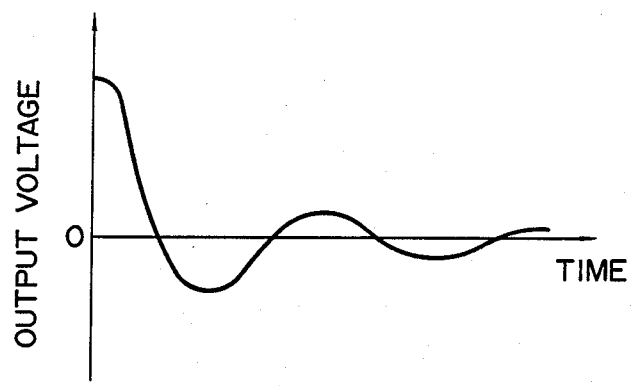
FIG. 4 is an output voltage characteristic diagram of logic circuit of FIG. 1.

In addition to CMOS inverters 14 and 15, the inverter circuit of this embodiment includes third CMOS inverter 16. An output signal of CMOS inverter 14, which is used to control the gate of MOSFET Q4 of the FIG. 4 circuit, is used only to drive the base current of pull-up transistor Q1, and an output signal of third CMOS inverter 16 is supplied to control the gate of MOSFET Q4. Therefore, since the switching timings of bipolar transistor Q1 and MOSFET Q4 can be independently set by means of CMOS inverters 14 and 16, the operation speed of this inverter can be further enhanced and power consumption reduced relative to the FIG. 5 circuit.

Figure 9:
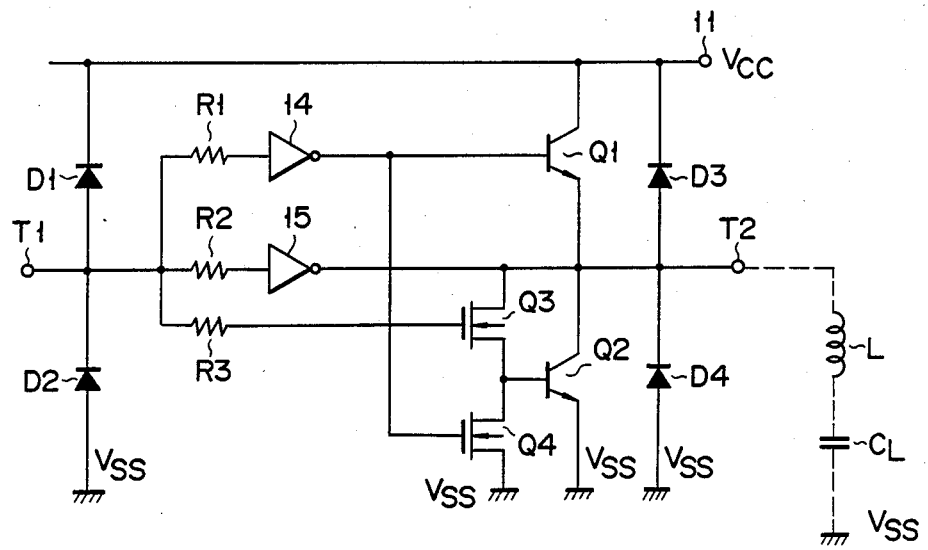

FIG. 9 shows an inverter circuit according to a third embodiment of this invention. In addition to the inverter circuit of FIG. 5, the inverter circuit according to this embodiment includes diodes D1 to D4 and resistors R1 to R3. Diodes D1 and D2 are respectively connected between power source potential Vcc terminal 11 and input terminal T1 and between input terminal T1 and ground terminal Vss, with the polarity as shown in FIG. 9. In other words, the anode and cathode of diode D1 are respectively connected to input terminal T1 and power source potential Vcc terminal 11, while the cathode and anode of diode D2 are respectively connected to input terminal T1 and ground terminal Vss. Likewise, diodes D3 and D4 are respectively connected between power source potential Vcc terminal 11 and output terminal T2 and between output terminal T2 and ground terminal Vss, with the polarity as shown in FIG. 9. In other words, the anode and cathode of diode D3 are respectively connected to output terminal T2 and power source potential Vcc terminal 11, while the cathode and anode of diode D4 are respectively connected to output terminal T2 and ground terminal Vss. Further, resistor R1 is connected between input terminal T1 and the input of CMOS inverter 14, resistor R2 is connected between input terminal T1 and the input of CMOS inverter 15, and resistor R3 is connected between input terminal T1 and the gate of N channel MOSFET Q3.

With the inverter circuit of this construction, overshooting and undershooting of an output signal can be clamped by means of diodes D3 and D4. Since diodes D1 and D2 and resistors R1 to R3 jointly function as an input protection circuit, the noise-resistance of this inverter circuit is further improved. The protection resistor is divided into R1 to R3 in order to reduce the delay of an input signal due to the protection resistance and the gate capacitance of the MOSFETs. As a result, it is possible to connect a protection resistor between input terminal T1 and the input terminals of CMOS inverters 14 and 15 and N channel MOSFET Q3 instead of resistors R1 to R3.

Figure 10:
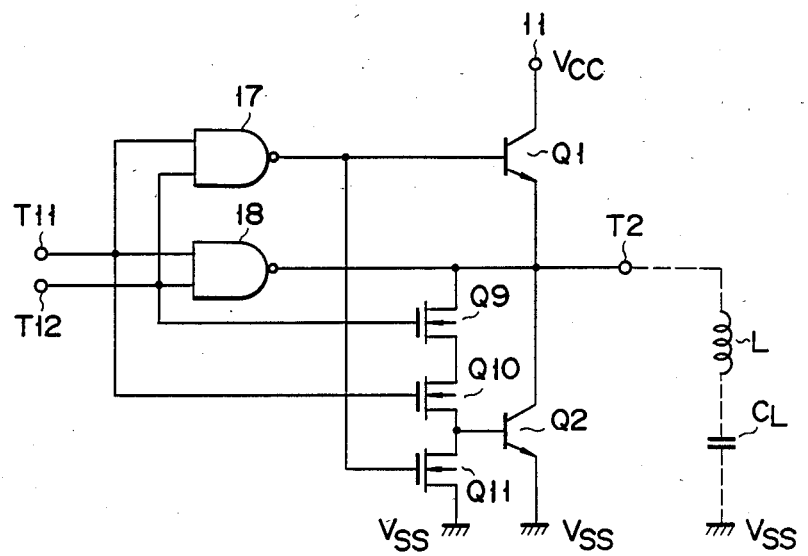

FIG. 10 is a logic circuit according to a fourth embodiment of this invention. The logic circuit of this embodiment includes a two-input NAND circuit.

In this two-input NAND circuit, the base current of pull-up NPN bipolar transistor Q1 is controlled by means of first two-input NAND gate (CMOS structure) 17. Input terminals of NAND gate 17 are respectively connected to input terminals T11 and T12. The base current of pulldown NPN bipolar transistor Q2 is controlled by a first switching means of N channel MOSFETs Q9 and Q10, and a second switching means of N channel MOSFET Q11. The drain-source or current paths of MOSFETs Q9 and Q10 are serially connected between output terminal T2 and the base of bipolar transistor Q2, and the gates thereof are respectively connected to input terminals T12 and T11. The current path of MOSFET Q11 is connected between the base of bipolar transistor Q2 and ground terminal Vss, and the gate thereof is connected to an output terminal of first NAND gate 17. Input terminals T11 and T12 are connected to the input terminals of second NAND gate (CMOS structure) 18 whose output terminal is connected to output terminal T2.

The operation of the circuit having the construction as described above will now be explained in detail.

When "H" level input signals are supplied to input terminals T11 and T12, the output signals of first and second NAND gates 17 and 18 are set at level "1", thereby causing pull-up bipolar transistor Q1 to be turned OFF. Since at this time MOSFETs Q9 and Q10 are set in the ON state and MOSFET Q11 in the OFF state, a base current is supplied from output terminal T2 to bipolar transistor Q2, to turn ON bipolar transistor Q2 which has a large current driving ability. This causes a rapid reduction of the voltage at output terminal T2. When the voltage at terminal T2 drops to voltage $V_{BE}$ between the base and emitter of bipolar transistor Q2, transistor Q2 is turned OFF and the voltage at terminal T2 is lowered to "L" level by only an output signal of second NAND gate 18 of CMOS structure and having a small current driving ability.

In the case where at least one of the input signals supplied to input terminals T11 and T12 is at "L" level, at least one of MOSFETs Q9 and Q10 is turned OFF, thereby preventing a base current from being supplied to bipolar transistor Q2 to keep OFF. Since at this time the output signal of NAND gate 17 is set at "H" level, bipolar transistor Q1 having a large current driving ability is turned ON. When the voltage at output terminal T2 is raised to "Vcc-$V_{BE}$" level, bipolar transistor Q1 is turned OFF and the voltage at output terminal T2 is raised to "H" level by only the "H" level output signal of second NAND gate 18.

As has been explained above, the ON-resistance of this NAND circuit is small at the beginning of the falling and rising of an output signal in the same manner as described in the inverter circuit of FIG. 5, and charges stored in load capacitor $C_L$ connected to output terminal T2 may be rapidly discharged. Further, when the voltage at output terminal T2 becomes higher than "Vcc-$V_{BE}$" or lower than $V_{BE}$, the ON-resistance becomes high so that a large damping effect can be applied to the resonant circuit of L and $C_L$.

In the fourth embodiment, two-input NAND gates 17 and 18 are used. However, n-input (n is an integer greater than 2) NAND gates can be used instead of NAND gates 17 and 18 in order to attain the same operation and effect as described above. In this case, n input terminals are provided, these being connected to the input terminals of the n-input NAND gate.

Figure 11:
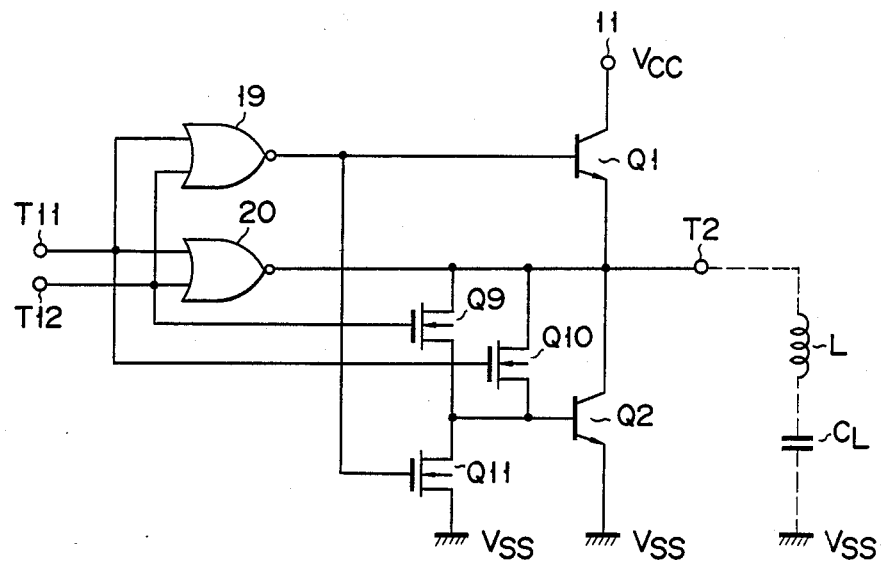

FIG. 11 shows a logic circuit according to a fifth embodiment of this invention. The logic circuit of this embodiment includes a two-input NOR circuit.

This two-input NOR circuit includes first and second NOR gates 19 and 20 instead of two-input NAND gates 17 and 18 as used in the circuit of FIG. 10, and a first switching means of N channel MOSFETs Q9 and Q10 whose drain-source paths are connected in parallel between output terminal T2 and the base of pull-down bipolar transistor Q2, and whose gates are respectively connected to input terminals T11 and T12. In other respects, the construction is the same as that of the FIG. 10 circuit.

When input signals of "L" level are supplied to input terminals T11 and T12 of this circuit, the output signals of first and second NOR gates 19 and 20 become "H" level, thereby turning ON pull-up bipolar transistor Q1. At this time, MOSFETs Q9 and Q10 are turned ON and MOSFET Q11 is turned OFF, turning OFF bipolar transistor Q2. This causes the voltage at output put terminal T2 to rise rapidly to power source potential Vcc. When the voltage at output terminal T2 is raised to "Vcc-$V_{BE}$" level, bipolar transistor Q1 is turned OFF and the voltage at output terminal T2 is raised to "H" level by only an output signal of second NOR gate 20 of CMOS structure and having a small current driving ability.

In the case where at least one of the input signals supplied to input terminals T11 and T12 is at "H" level, since at least one of MOSFETs Q9 and Q10 is turned ON, bipolar transistor Q1 is turned OFF. When the voltage at output terminal T2 drops to voltage $V_{BE}$ between the base and emitter of bipolar transistor Q2, transistor Q2 is turned OFF, and the voltage at output terminal T2 is lowered to "L" level by only an "L" level output signal of second NOR gate 20.

With the two-input NOR circuit as described above, the high speed operation and damping effect on the ringing can be attained in the same manner as described in the two-input NAND circuit.

In the fifth embodiment, two-input NOR gates 19 and 20 are used. However, it is also possible to use an n-input (n is an integer larger than 2) NOR gate in order to attain the same operation and effect as described above. In this case, n input terminals are provided and these n input terminals are connected to input terminals of the n-input NOR gate.

Further, in the embodiments of FIGS. 1 to 5, bipolar transistors Q1 and Q2 are of NPN type, MOSFETs Q5 and Q7 are of P channel type and MOSFETs Q3, Q4, Q6, and Q8 to Q11 are of N channel type. However, the transistors can be changed to have opposite conductivity types and at this time the connections with respect to the power source and the ground terminal are changed. The inverter circuit, NAND circuit and NOR circuit are explained as examples of a logic circuit, but this invention can be applied to other logic circuits.

What is claimed is:

1. A logic circuit used in a standard IC of CMOS logic level, comprising:
    signal input means for receiving input data;
    a signal output terminal;
    a first potential supply source;
    a second potential supply source;
    first and second bipolar transistors each having a base, collector, and emitter, the collector-emitter paths being serially connected to each other at a connection node between said first and second potential supply sources, the connection node of said first and second bipolar transistors being connected to said signal output terminal for setting the signal output terminal to a first potential level;
    first CMOS logic means having an input terminal connected to said signal input means and an output terminal connected to the base of said first bipolar transistor;
    second CMOS logic means having an input terminal connected to said signal input means and an output terminal connected to said signal output terminal, said second CMOS logic means being operative to change said first potential level of the signal output terminal to the potential level of one of said first and second potential supply sources;
    first switching means connected between said signal output terminal and the base of said second bipolar transistor, operative to be switched OFF at times when the input data is set at a potential level corresponding to the level for rendering said first bipolar transistor conductive, and operative to be switched ON at times when the input data is set at a potential level corresponding to the level for rendering said first bipolar transistor nonconductive; and
    second switching means connected between said second potential supply source and the base of said second bipolar transistor, operative to be switched OFF at times when the input data is set at a potential level corresponding to the level for rendering said first bipolar transistor conductive, and operative to be switched ON at times when the input data is set at a potential level corresponding to the level for rendering said first bipolar transistor nonconductive, wherein said signal input means is a signal input terminal, each of said first and second CMOS logic means is a CMOS inverter, and said first switching means comprises an N channel MOSFET whose drain-source path is connected between said signal output terminal and the base of said second bipolar transistor, and whose gate is connected to said signal input terminal.

2. A logic circuit according to claim 1, wherein said second switching means comprises an N channel MOSFET whose drain-source path is connected between the base of said second bipolar transistor and said second potential supply source, and whose base is connected to an output terminal of said first CMOS inverter.

3. A logic circuit according to claim 1, which further comprises a CMOS inverter having input terminal connected to said signal input means and wherein said second switching means includes an N channel MOSFET having a drain-source path connected between the base of said second bipolar transistor and said second potential supply source, and having a gate connected to an output terminal of said CMOS inverter.

4. A logic circuit used in a standard IC of CMOS logic level, comprising:
    signal input means for receiving input data;
    a signal output terminal;
    a first potential supply source;
    a second potential supply source;
    first and second bipolar transistors each having a base, collector, and emitter, the collector-emitter paths being serially connected to each other at a connection node between said first and second potential supply sources, the connection node of said first and second bipolar transistors being connected to said signal output terminal for setting the signal output terminal to a first potential level;

first CMOS logic means having an input terminal connected to said signal input means and an output terminal connected to the base of said first bipolar transistor;

second CMOS logic means having an input terminal connected to said signal input means and an output terminal connected to said signal output terminal, said second CMOS logic means being operative to change said first potential level of the signal output terminal to the potential level of one of said first and second potential supply sources;

first switching means connected between said signal output terminal and the base of said second bipolar transistor, operative to be switched OFF at times when the input data is set at a potential level corresponding to the level for rendering said first bipolar transistor conductive, and operative to be switched ON at times when the input data is set at a potential level corresponding to the level for rendering said first bipolar transistor nonconductive;

second switching means connected between said second potential supply source and the base of said second bipolar transistor, operative to be switched OFF at times when the input data is set at a potential level corresponding to the level for rendering said first bipolar transistor conductive, and operative to be switched ON at times when the input data is set at a potential level corresponding to the level for rendering said first bipolar transistor nonconductive;

a first diode whose anode and cathode are connected to said signal input means and said first potential supply source; a second diode whose cathode and anode are connected to said signal input means and said second potential supply source; a third diode whose anode and cathode are connected to said signal output terminal and said first potential supply source; a fourth diode whose cathode and anode are connected to said signal output terminal and said second potential supply source; a first resistor connected between said signal input means and said first CMOS logic means; a second resistor connected between said input means and said second CMOS logic means; and a third resistor connected between said signal input means and said first switching means.

5. A logic circuit used in a standard IC of CMOS logic level, comprising:

signal input means for receiving input data;
a signal output terminal;
a first potential supply source;
a second potential supply source;
first and second bipolar transistors each having a base, collector, and emitter, the collector-emitter paths being serially connected to each other at a connection node between said first and second potential supply sources, the connection node of said first and second bipolar transistors being connected to said signal output terminal for setting the signal output terminal to a first potential level;

first CMOS logic means having an input terminal connected to said signal input means and an output terminal connected to the base of said first bipolar transistor;

second CMOS logic means having an input terminal connected to said signal input means and an output terminal connected to said signal output terminal, said second CMOS logic means being operative to change said first potential level of the signal output terminal to the potential level of one of said first and second potential supply sources;

first switching means connected between said signal output terminal and the base of said second bipolar transistor, operative to be switched OFF at times when the input data is set at a potential level corresponding to the level for rendering said first bipolar transistor conductive, and operative to be switched ON at times when the input data is set at a potential level corresponding to the level for rendering said first bipolar transistor nonconductive; and second switching means connected between said second potential supply source and the base of said second bipolar transistor, operative to be switched OFF at times when the input data is set at a potential level corresponding to the level for rendering said first bipolar transistor conductive, and operative to be switched ON at times when the input data is set at a potential level corresponding to the level for rendering said first bipolar transistor nonconductive, wherein said signal input means includes n (which is an integer greater than 1) signal input terminals, each of said first and second CMOS logic means comprises an n-input NAND gate, and said first switching means comprises n number of N channel MOSFETs whose drain-source paths are serially connected between said signal output terminal and the base of said second bipolar transistor, and whose gates are respectively connected to said signal input terminals.

6. A logic circuit used in a standard IC of CMOS logic level, comprising:

signal input means for receiving input data;
a signal output terminal;
a first potential supply source;
a second potential supply source;
first and second bipolar transistors each having a base, collector, and emitter, the collector-emitter paths being serially connected to each other at a connection node between said first and second potential supply sources, the connection node of said first and second bipolar transistors being connected to said signal output terminal for setting the signal output terminal to a first potential level;

first CMOS logic means having an input terminal connected to said signal input means and an output terminal connected to the base of said first bipolar transistor;

second CMOS logic means having an input terminal connected to said signal input means and an output terminal connected to said signal output terminal, said second CMOS logic means being operative to change said first potential level of the signal output terminal to the potential level of one of said first and second potential supply sources;

first switching means connected between said signal output terminal and the base of said second bipolar transistor, operative to be switched OFF at times when the input data is set at a potential level corresponding to the level for rendering said first bipolar transistor conductive, and operative to be switched ON at times when the input data is set at a potential level corresponding to the level for rendering said first bipolar transistor nonconductive; and second switching means connected between said second potential supply source and the base of said second bipolar transistor, operative to be switched OFF at times when the input data is set a potential level corresponding to the level for rendering said first bipolar transistor conductive, and operative to be switched ON at times when the input data is set at a potential level corresponding to the level for rendering said first bipolar transistor nonconductive, wherein said signal input means includes n (which is an integer greater than 1) signal input terminals, each of said first and second CMOS logic means comprises an n-input NOR gate, and said first switching means comprising n number of N channel MOSFETs whose drain-source paths are connected in parallel between said signal output terminal and the base of said second bipolar transistor, and whose gates are respectively connected to said signal input terminals.

* * * * *